United States Patent
Kodama

(10) Patent No.: US 9,420,726 B2
(45) Date of Patent: Aug. 16, 2016

(54) CONTAINER-TYPE DATA CENTER AND AIR-CONDITIONING CONTROL METHOD

(71) Applicant: FUJITSU LIMITED, Kawasaki-shi, Kanagawa (JP)

(72) Inventor: Hiroyoshi Kodama, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 586 days.

(21) Appl. No.: 13/942,743

(22) Filed: Jul. 16, 2013

(65) Prior Publication Data

US 2014/0092549 A1  Apr. 3, 2014

(30) Foreign Application Priority Data

Sep. 28, 2012  (JP) .................................. 2012-217959

(51) Int. Cl.
*H05K 7/20*  (2006.01)

(52) U.S. Cl.
CPC ........ *H05K 7/20727* (2013.01); *H05K 7/20745* (2013.01); *H05K 7/20836* (2013.01)

(58) Field of Classification Search
None
See application file for complete search history.

(56) References Cited

U.S. PATENT DOCUMENTS

| 2009/0277622 | A1* | 11/2009 | Nair | F24F 11/0001 165/246 |
| 2011/0103008 | A1* | 5/2011 | Aklilu | G06F 1/20 361/679.48 |
| 2013/0135819 | A1* | 5/2013 | Wang | H04L 41/00 361/679.48 |

FOREIGN PATENT DOCUMENTS

| JP | 59-192990 A | 11/1984 |
| JP | 2000-346512 A | 12/2000 |
| JP | 2009-27051 A | 2/2009 |
| JP | 2010-27911 A | 2/2010 |
| JP | 2011-226737 | 11/2011 |
| JP | 2012-38100 | 2/2012 |
| JP | 2012-48549 | 3/2012 |

OTHER PUBLICATIONS

Japanese Office Action mailed Apr. 5, 2016 for corresponding Japanese Patent Application No. 2012-217959, with Partial English Translation, 4 pages.

* cited by examiner

*Primary Examiner* — Kenneth M Lo
*Assistant Examiner* — Geoffrey Wellman
(74) *Attorney, Agent, or Firm* — Fujitsu Patent Center

(57) ABSTRACT

A container includes a server and a management server. A general fan takes in outside air to the container and sends the taken-in outside air to the server. An internal server fan is built into the server and cools down a CPU provided in the server. A fan-operation management unit controls rotation speeds of the internal server fan and the general fan based on a temperature of the CPU.

10 Claims, 12 Drawing Sheets

FIG.3

| CPU TEMPERATURE (°C) | ROTATION SPEED OF INTERNAL SERVER FAN (rpm) | ROTATION SPEED OF GENERAL FAN (UPON INCREASE IN TEMPERATURE) (rpm) | ROTATION SPEED OF GENERAL FAN (UPON DECREASE IN TEMPERATURE) (rpm) |
|---|---|---|---|
| 20 | 2000 | 1500 | 1500 |
| 30 | 2000 | 1500 | 1500 |
| 40 | 2000 | 1500 | 1500 |
| 50 | 2000 | 1500 | 1500 |
| 60 | 2000 | 2000 | 2500 |
| 70 | 2000 | 2000 | 2500 |
| 80 | 12000 | 3500 | 4000 |
| 90 | 14500 | 4500 | 4500 |
| 100 | 15000 | 4500 | 4500 |

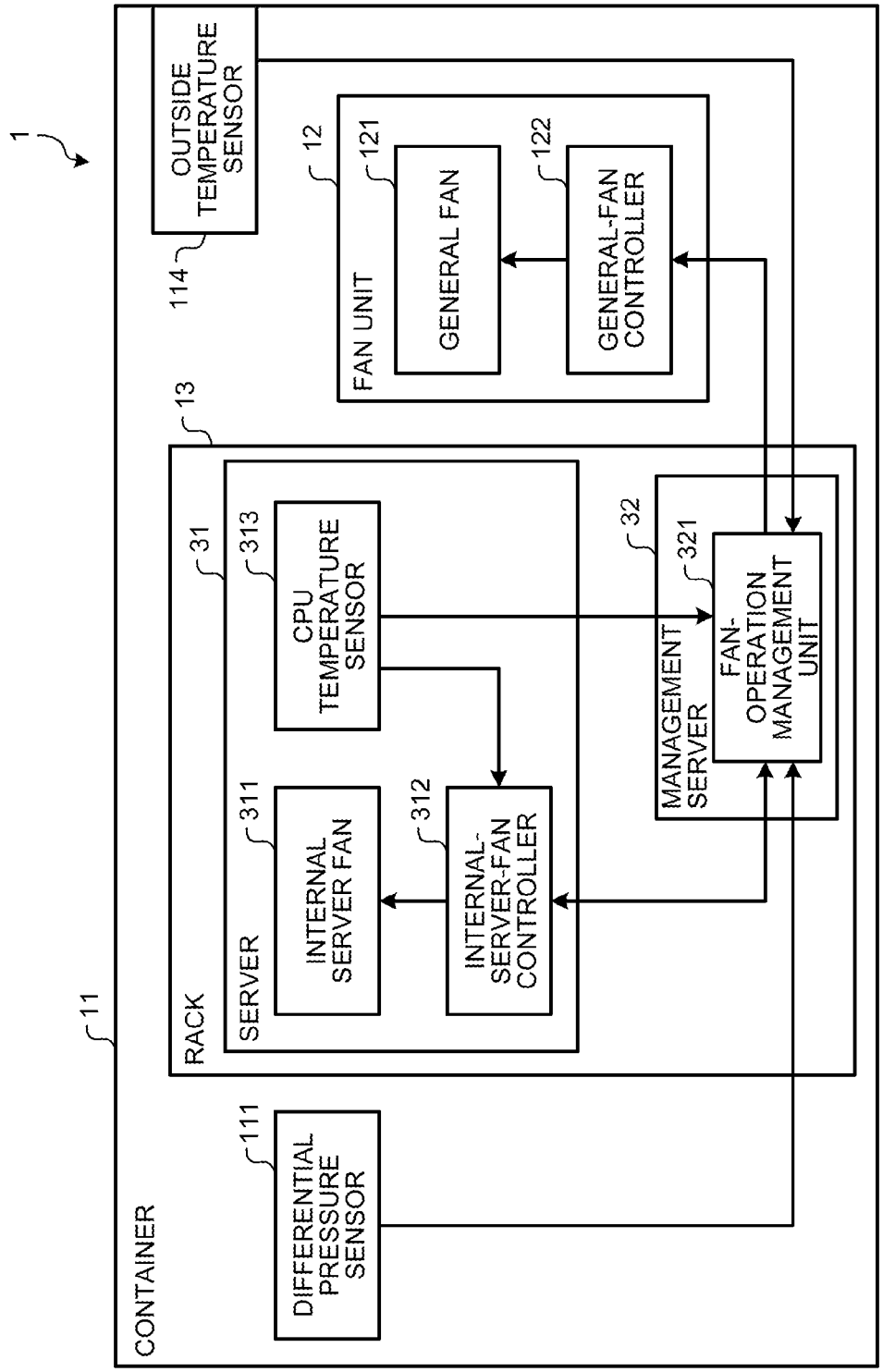

CONTAINER-TYPE DATA CENTER AND AIR-CONDITIONING CONTROL METHOD

CROSS-REFERENCE TO RELATED APPLICATION

This application is based upon and claims the benefit of priority of the prior Japanese Patent Application No. 2012-217959, filed on Sep. 28, 2012, the entire contents of which are incorporated herein by reference.

FIELD

The embodiments discussed herein are related to a container-type data center, an air-conditioning control program, and an air-conditioning control method.

BACKGROUND

A data center is provided as a facility in which a large number of hardware including servers and communication devices are integrally located and operated. Some data centers are located as part of an existing building. Cloud computing is being widespread these days, and the scale of the data center is increasing. Therefore, further power saving is desired in a large-scale data center.

A container-type data center with low initial investment cost is proposed for constructing such a large-scale data center. The container-type data center is beginning to rapidly spread because this data center is a portable data center that is easily expandable according to the scale of an entire data center and is a form effective in implementation of power saving by reducing total power consumption.

Devices to be installed in the container-type data center are electronic computers such as network devices, storage devices, and servers. Some of the devices placed in the data center have components that produce heat such as a Central Processing Unit (CPU) as a computer device and a memory as a storage device. When the temperature of these components increases, air conditioning is used to reduce the temperature of the components, which also reduces the temperature inside the container.

There is a chiller-used air conditioning system as one of air conditioning systems for the container-type data center. When the air conditioning system is used, however, electric power is used to cool down the air. Because of this, the air conditioning system can be considered that the power consumption is increased. Therefore, attention is focused on an outside air cooling system in terms of power saving for air conditioning. Particularly, one of air conditioning systems effective in power saving is a direct outside air system that takes in outside air to the container-type data center and uses the outside air to cool down the components such as CPU that have produced heat and the temperature inside the container.

As the direct outside air system, a conventional technology is proposed in which a large-scale air conditioning fan fixed to the container is used to take in air from the outside to the container and a server uses a fan provided in its own to take in the air to a housing and cool down a heat-producing component and the like (e.g., see Product Catalogue of SGI® Ice Cube® Air: SGI Japan, Ltd.). In this conventional technology, a plurality of air conditioning fans that generate an air volume sufficient enough to cool down the server are provided in consideration of redundancy.

As the air conditioning system of the data center, a conventional technology is proposed in which an air volume of a floor fan is controlled from an operation rate of a server (e.g., see Japanese Laid-open Patent Publication No. 2011-226737). A conventional technology is also proposed in which groups of a plurality of servers in a data center are separated by blocks and air conditioning is performed on the blocks (e.g., see Japanese Laid-open Patent Publication No. 2012-048549). Furthermore, a conventional technology is proposed in which rotation of a fan in a container is controlled according to a temperature in the container (e.g., see Japanese Laid-open Patent Publication No. 2012-038100).

A rotation speed of an internal server fan in a data center is controlled to be appropriate for cooling based on its internal temperature and a temperature of heat-producing components, and the like. In the container-type data center, on the other hand, wind is sent toward a server also by a fan provided in the container. Because of this, a cooling effect due to the fan provided in the container can also lower the temperature of the heat-producing components and the like. Therefore, in consideration of both the cooling effect of the fan provided in the container and the cooling effect of the internal server fan, it is desirable to determine each rotation speed of the fans. However, in the conventional air conditioning systems, the internal server fan and the fans provided in the container independently operate, and therefore it is difficult to perform effective cooling, which makes it difficult to suppress power consumption.

In one aspect of the container-type data center, the air-conditioning control program, and the air-conditioning control method disclosed in the present application, a container includes an electronic device. A first fan takes in outside air to the container and sends the taken-in outside air to the electronic device. A second fan is built into the electronic device and cools down the inside of the electronic device. A control unit controls a rotation speed of the first fan based on a rotation speed of the second fan.

SUMMARY

According to an aspect of an embodiment, a container-type data center includes: a container that includes an electronic device; a first fan that takes in outside air to the container and sends the taken-in outside air to the electronic device; a second fan that is built into the electronic device and cools down a heat-producing component provided in the electronic device; and a control unit that controls a rotation speed of the first fan and a rotation speed of the second fan based on a temperature of the heat-producing component.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 is a diagram illustrating rotation speeds of an internal server fan and a general fan corresponding to a CPU temperature in the container-type data center according to the first embodiment;

FIG. 13 is a block diagram of a container-type data center according to a third embodiment.

DESCRIPTION OF EMBODIMENTS

Preferred embodiments of the present invention will be explained with reference to accompanying drawings. The container-type data center, the air-conditioning control program, and the air-conditioning control method disclosed in the present application are not limited by the following embodiments.

Figure 1:
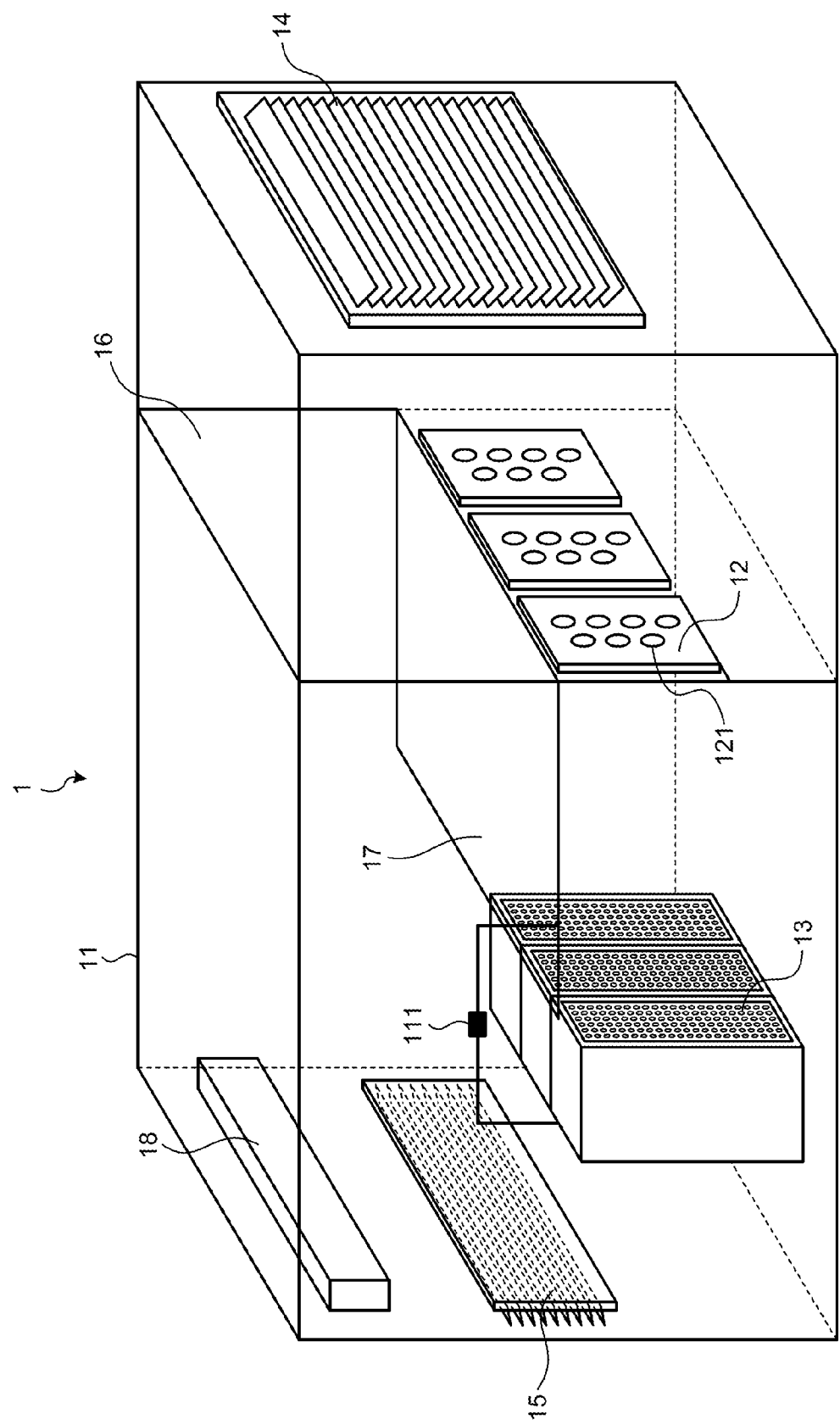
FIG. 1 is a schematic configuration of a container-type data center.

FIG. 1 is a schematic configuration of a container-type data center. Any configuration other than portions used for explanation on the present invention is omitted in FIG. 1. For example, a duct connecting between a cold area and a hot area is omitted.

A container-type data center 1 includes a fan unit 12, a rack 13, an outside air intake 14, an exhaust slot 15, a divider plate 16, a divider plate 17, and a power panel 18, which are arranged in a container 11.

In the container 11, the rack 13, the divider plate 16, and the divider plate 17 are used to form a cold aisle being a space that contains cold air taken in by a server included in the rack 13 and to form a hot aisle being a space that contains exhaust heat of the server included in the rack 13. As illustrated in FIG. 1, a space on the right side of the divider plate 16 and a space on the right side of the rack 13 and below the divider plate 17 form cold aisles. A space on the left side of the rack 13 and a space on the left side of the divider plate 16 and above the divider plate 17 form hot aisles.

The outside air intake 14 is an opening through which outside air is introduced to the cold aisle side of the container 11.

The exhaust slot 15 is an opening through which air in the hot aisle of the container 11 is exhausted to the outside.

The fan unit 12 has a plurality of general fans 121. Furthermore, the container 11 has three fan units 12 in the present embodiment.

The general fan 121 is rotated to introduce outside air to the container 11 through the outside air intake 14. Furthermore, the general fan 121 is rotated to blow the air in the cold aisle to the rack 13. The air sent by the general fan 121 to the rack 13 cools down an electronic device included in the rack 13 or a CPU as a processing unit in a server as an information processing unit and a memory as a storage device. The general fan 121 corresponds to an example of "first fan".

The rack 13 includes, for example, a plurality of electronic devices such as a server, a switch, and a storage. The server, the switch, and the storage are stored inside the rack 13 and are therefore not illustrated in FIG. 1. Particularly, in the present embodiment, the rack 13 has a management server for managing servers and general fans 121 and the like (hereinafter, "management server") and the servers for performing actual processes (hereinafter, "server").

The server includes an internal server fan (not illustrated) for cooling down the CPU and the memory. The internal server fan is rotated to absorb the air in the cold aisle side and send the absorbed air to the CPU and the memory or so, thereby cooling down the CPU and the memory. In other words, the CPU and the memory are cooled down by both the air sent by the general fans 121 and the internal server fan.

The air sent by the general fans 121 and the internal server fan is heated by taking heat from the CPU and the memory. The heated air is then exhausted to the hot aisle side in the container 11. The air in the hot aisle side is exhausted to the outside through the exhaust slot 15.

The power panel 18 is collectively provided with power systems for supplying power to the servers in the rack 13 and to the fan units 12. The power panel 18 takes in power from the outside, and uses the power systems to supply the power to the electronic devices such as the servers and to the fan units 12. The electronic devices such as the servers and the fan units 12 operate by the power supplied from the power panel 18.

Figure 2:
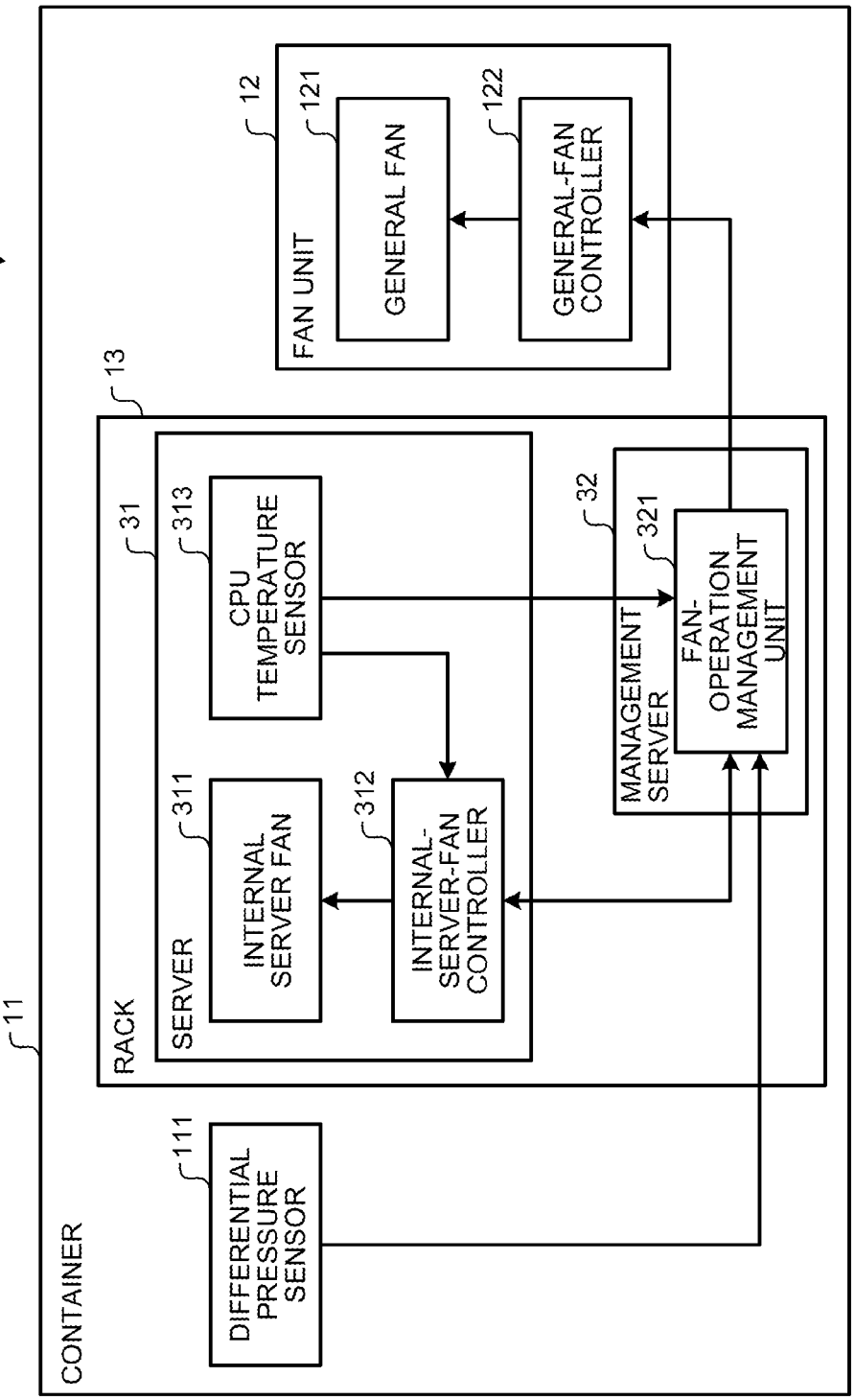
FIG. 2 is a block diagram of a container-type data center according to a first embodiment.

The process for air conditioning control of the container-type data center 1 according to the present embodiment will be explained below with reference to FIG. 2. FIG. 2 is a block diagram of the container-type data center according to the first embodiment.

As illustrated in FIG. 2, for example, a server 31 and a management server 32 are arranged in the rack 13 included in the container-type data center 1. Although only one server 31 is described in FIG. 2, a plurality of units may be included in the rack 13. The server 31 corresponds to an example of "electronic device". The rack 13 may also be provided in plural. The fan unit 12 provided in the container-type data center 1 includes the general fan 121 and a general-fan controller 122. In addition, the container-type data center 1 includes a differential pressure sensor 111 that measures a difference between a pressure in the cold aisle side and a pressure in the hot aisle side of the rack 13.

The differential pressure sensor 111 measures a difference between a pressure in the fan unit 12 side of the rack 13 i.e. the cold aisle side and a pressure in the exhaust slot 15 side thereof i.e. the hot aisle side. The differential pressure sensor 111 calculates a differential pressure by subtracting the pressure in the hot aisle side from the pressure in the cold aisle side. The differential pressure is explained below. The server 31 incorporated in the rack 13 sends the air in the cold aisle side to the hot aisle side in order to cool down the CPU and the memory. Therefore, in the rack 13, the pressure in the cold aisle side is preferably higher than the pressure in the hot aisle side. In other words, the differential pressure measured by the differential pressure sensor 111 is preferably positive.

The server 31 includes an internal server fan 311, an internal-server-fan controller 312, and a CPU temperature sensor 313.

The internal server fan 311 rotates at the rotation speed instructed from the internal-server-fan controller 312 to take in air in the cold aisle side. The internal server fan 311 then sends the taken-in air in the cold aisle side to the CPU (not illustrated) provided in the server 31. The internal server fan 311 has a minimum rotation speed. That is, the internal server fan 311 is made to rotate at the minimum rotation speed or higher when a power supply of the server 31 is turned on. The internal server fan 311 corresponds to an example of "second fan".

The CPU temperature sensor 313 measures a temperature of the CPU provided in the server 31. When a plurality of CPUs are provided therein, the CPU temperature sensor 313 measures a temperature of each of the CPUs. The CPU temperature sensor 313 then outputs measurement results to the internal-server-fan controller 312 and a fan-operation management unit 321 in the management server 32 explained later. The CPU temperature sensor 313 corresponds to an example of "temperature sensor".

The internal-server-fan controller 312 implements its function by, for example, firmware in a Base Management Controller (BMC) which is a management chip included in the server 31. The internal-server-fan controller 312 stores therein a temperature-rotation speed correspondence table that describes a correspondence between the CPU temperature and the rotation speed of the internal server fan 311. As an example of the temperature-rotation speed correspondence table, the reference as follows may be set. For example, when the CPU temperature exceeds a temperature lower by 20° C. than the upper limit of an allowable value of the CPU temperature, a duty being the rotation speed of the internal server fan 311 is set to 60%. When the CPU temperature exceeds a temperature lower by 10° C. than the upper limit of the allowable value of the CPU temperature, a duty being the rotation speed of the internal server fan 311 is set to 80% in the temperature-rotation speed correspondence table. When the CPU temperature reaches the upper limit of the allowable value, the internal server fan 311 is set to correspond to a maximum rotation speed in the temperature-rotation speed correspondence table. In this case, the temperature lower by 20° C. than the upper limit of the allowable value corresponds to an example of "first threshold", and the temperature lower by 10° C. than the upper limit thereof corresponds to an example of "second threshold". The rotation speed with 60% duty corresponds to an example of "first rotation speed", and the rotation speed with 80% duty corresponds to an example of "second rotation speed".

More specifically, for example, the temperature-rotation speed correspondence table is a table formed by a column 401 representing a CPU temperature in FIG. 3 and a column 402 representing the rotation speed of the internal server fan therein. FIG. 3 is a diagram illustrating rotation speeds of the internal server fan and the general fan corresponding to the CPU temperature in the container-type data center according to the first embodiment. Although FIG. 3 depicts an example of measured values of the internal server fan 311 and of the general fan 121 with respect to the CPU temperatures, this example is used herein for explanation as an example of the registration contents of the temperature-rotation speed correspondence table. In the temperature-rotation speed correspondence table that includes the contents of the column 401 and the column 402 in FIG. 3, the upper limit of the allowable value of the CPU temperature is 100° C.

The internal-server-fan controller 312 receives an input as a measurement result of the CPU temperature from the CPU temperature sensor 313. The internal-server-fan controller 312 then acquires the rotation speed of the internal server fan 311 corresponding to the received CPU temperature from the temperature-rotation speed correspondence table. Subsequently, the internal-server-fan controller 312 controls the internal server fan 311 so as to rotate at the acquired rotation speed. When a plurality of CPUs are provided, the internal-server-fan controller 312 determines the highest temperature among CPU temperatures input from the CPU temperature sensor 313 as a CPU temperature.

The case in which the internal-server-fan controller 312 stores the temperature-rotation speed correspondence table having the contents of the column 401 and the column 402 in FIG. 3 will be explained below. For example, when the CPU temperature is 20° C. to 70° C., the internal-server-fan controller 312 controls the internal server fan 311 so as to rotate at 2000 rpm being the minimum rotation speed. When the CPU temperature is 70° C. or higher and lower than 80° C., the internal-server-fan controller 312 controls the internal server fan 311 so as to rotate at 12000 rpm. When the CPU temperature is 80° C. or higher and lower than 90° C., the internal-server-fan controller 312 controls the internal server fan 311 so as to rotate at 14500 rpm. Furthermore, when the CPU temperature reaches 90° C. or higher, the internal-server-fan controller 312 controls the internal server fan 311 so as to rotate at 15000 rpm. A step at which the internal-server-fan controller 312 increases the rotation speed of the internal server fan 311 from the minimum rotation speed so as to rotate at 12000 rpm is hereinafter called "first step of an increase in the rotation speed". A step at which the internal-server-fan controller 312 increases the rotation speed of the internal server fan 311 from 12000 rpm so as to rotate at 14500 rpm is hereinafter called "second step of an increase in the rotation speed". In this case, 70° C. corresponds to an example of "first threshold", and 80° C. corresponds to an example of "second threshold". Furthermore, 12000 rpm corresponds to an example of "first rotation speed", and 14500 rpm corresponds to an example of "second rotation speed".

The internal-server-fan controller 312 then notifies the fan-operation management unit 321 in the management server 32, explained below, of the rotation speed of the internal server fan 311.

The management server 32 includes the fan-operation management unit 321. The fan-operation management unit 321 receives an input being a measurement result of a differential pressure between the pressure in the cold aisle side and the pressure in the hot aisle side of the rack 13 from the differential pressure sensor 111. The fan-operation management unit 321 also receives an input being the CPU temperature of the server 31 from the CPU temperature sensor 313. Furthermore, the fan-operation management unit 321 receives an input being the rotation speed of the internal server fan 311 from the internal-server-fan controller 312.

The fan-operation management unit 321 stores therein a temperature, as a preparation threshold, lower than the temperature at which the internal-server-fan controller 312 increases the rotation speed of the internal server fan 311. For example, when the internal server fan 311 is controlled by using the temperature-rotation speed correspondence table with the contents of the column 401 and the column 402 in FIG. 3, the fan-operation management unit 321 stores therein a temperature of 60° C. that is lower than 80° C. as the preparation threshold.

The fan-operation management unit 321 also stores therein a preliminary rotation speed for previously rotating the general fan 121 in order to appropriately follow an increase in the rotation of the internal server fan 311 upon an increase in temperature. Likewise, the fan-operation management unit 321 stores therein a cooling rotation speed being a rotation speed higher than the preliminary rotation speed, which is a rotation speed for previously rotating the general fan 121, in order to promote cooling of the CPU that is hard to cool upon a decrease in temperature. In the present embodiment, the fan-operation management unit 321 stores therein 2000 rpm as the preliminary rotation speed. The fan-operation management unit 321 also stores therein 2500 rpm, as the cooling rotation speed, higher by 500 rpm than the preliminary rotation speed. The values of the preliminary rotation speed and the cooling rotation speed are preferably set so as to be values at which the rotation speeds can appropriately follow the rotation of the internal server fan 311 according to the degree of an increase in the rotation.

Furthermore, the fan-operation management unit 321 stores therein a preliminary table that describes a change in the CPU temperature and a change in the rotation speed in order to change the rotation speed of the general fan 121 from the minimum rotation speed to the preliminary rotation speed upon an increase in temperature. The fan-operation management unit 321 also stores therein a table for cooling that describes a change in the CPU temperature and a change in the rotation speed in order to change the rotation speed of the general fan 121 from the cooling rotation speed to the minimum rotation speed upon a decrease in temperature.

The fan-operation management unit 321 has a table for temperature increase and a table for temperature decrease used to increase or decrease the rotation speed. In the table for temperature decrease, an increase or a decrease of the rotation speed becomes higher when the CPU temperature is displaced by 1° C. as compared with the table for temperature increase when the rotation speed at the first step is increased. For example, the fan-operation management unit 321 stores therein a table, as the table for temperature increase, representing a function consisting of a linear function with a gradient so that the rotation speed is changed from 2000 rpm to 3500 rpm at 70° C. to 80° C. and a linear function with a gradient so that the rotation speed is changed from 3500 rpm to 4500 rpm at 80° C. to 90° C. The fan-operation management unit 321 also stores therein a table, as the table for temperature decrease, representing a function consisting of a linear function with a gradient so that the rotation speed is changed from 2500 rpm to 4000 rpm at 70° C. to 80° C. and a linear function with a gradient so that the rotation speed is changed from 4000 rpm to 4500 rpm at 80° C. to 90° C.

When the power supply of the fan unit 12 is turned on, the fan-operation management unit 321 instructs the general-fan controller 122 to rotate the general fan 121 at the minimum rotation speed. In the present embodiment, the minimum rotation speed of the general fan 121 is 1500 rpm.

Thereafter, the fan-operation management unit 321 determines whether the CPU temperature received from the CPU temperature sensor 313 has exceeded the preparation threshold. When the CPU temperature received from the CPU temperature sensor 313 has not exceeded the preparation threshold, the fan-operation management unit 321 instructs the general-fan controller 122 to maintain the rotation speed of the general fan 121 at the minimum rotation speed.

Meanwhile, when the CPU temperature received from the CPU temperature sensor 313 has exceeded the preparation threshold, the fan-operation management unit 321 determines whether the CPU temperature is measured upon an increase in temperature or upon a decrease in temperature. If it is measured upon an increase in temperature, the fan-operation management unit 321 refers to the preliminary table when the differential pressure is negative to acquire a rotation speed at which the CPU temperature is increased by 1° C. The fan-operation management unit 321 then instructs the general-fan controller 122 to increase the rotation speed of the general fan 121 by the acquired rotation speed and to make the rotation speed become the preliminary rotation speed at a temperature of 70° C. In the present embodiment, in this case, the fan-operation management unit 321 instructs the general-fan controller 122 to make the rotation speed of the general fan 121 become 2000 rpm being the preliminary rotation speed. On the other hand, if it is measured upon a decrease in temperature, the fan-operation management unit 321 refers to the table for cooling when the differential pressure is negative to acquire a rotation speed corresponding to 1° C. of the CPU temperature. The fan-operation management unit 321 then increases the rotation speed of the general fan 121 by the acquired rotation speed. In the present embodiment, in this case, the fan-operation management unit 321 instructs the general-fan controller 122 to make the rotation speed of the general fan 121 become 2500 rpm being the cooling rotation speed at a temperature of 60° C.

Furthermore, when the rotation speed of the internal server fan 311 received from the internal-server-fan controller 312 reaches a rotation speed at the first step of the increase in the rotation, the fan-operation management unit 321 determines whether the CPU temperature is measured upon an increase in temperature or upon a decrease in temperature. When the differential pressure received from the differential pressure sensor 111 is negative upon an increase in temperature, the fan-operation management unit 321 acquires a rotation speed at which the CPU temperature is increased by 1° C. from the table for temperature increase. The fan-operation management unit 321 then instructs the general-fan controller 122 to control the rotation speed of the general fan 121 so as to be increased by the acquired rotation speed. When the differential pressure received from the differential pressure sensor 111 is negative upon a decrease in temperature, the fan-operation management unit 321 acquires a rotation speed at which the CPU temperature is decreased by 1° C. from the table for temperature decrease. The fan-operation management unit 321 then instructs the general-fan controller 122 to control the rotation speed of the general fan 121 so as to be decreased by the acquired rotation speed.

Moreover, when the rotation speed of the internal server fan 311 received from the internal-server-fan controller 312 reaches a rotation speed at the second step of the increase in rotation, the fan-operation management unit 321 determines whether the CPU temperature is measured upon an increase in temperature or upon a decrease in temperature. When the differential pressure received from the differential pressure sensor 111 is negative upon an increase in temperature, the fan-operation management unit 321 acquires a rotation speed at which the CPU temperature is increased by 1° C. from the table for temperature increase. The fan-operation management unit 321 then instructs the general-fan controller 122 to control the rotation speed of the general fan 121 so as to be increased by the acquired rotation speed. When the differential pressure received from the differential pressure sensor 111 is negative upon a decrease in temperature, the fan-operation management unit 321 acquires a rotation speed at which the CPU temperature is decreased by 1° C. from the table for temperature decrease. The fan-operation management unit 321 then instructs the general-fan controller 122 to control the rotation speed of the general fan 121 so as to be decreased by the acquired rotation speed.

When the rotation speed of the internal server fan 311 received from the internal-server-fan controller 312 is the maximum rotation speed, the fan-operation management unit 321 instructs the general-fan controller 122 to control the rotation speed of the general fan 121 so as to be the maximum rotation speed both upon an increase in temperature and upon a decrease in temperature. Furthermore, in this state, when the pressure in the cold aisle is lower than the pressure in the hot aisle in the rack 13, the fan-operation management unit 321 instructs the internal-server-fan controller 312 to decrease the rotation speed of the internal server fan 311.

As explained above, a change in the rotation speed when the fan-operation management unit 321 controls the rotation speed of the general fan 121 is represented in FIG. 3. The changes in the rotation speeds of the internal server fan 311 and the general fan 121 will be explained below with reference to FIG. 3.

As illustrated in FIG. 3, values in a column 403 represent rotation speeds of the general fan 121 upon an increase in temperature, and values in a column 404 represent rotation speeds of the general fan 121 upon a decrease in temperature.

When the CPU temperature reaches 50° C. or higher as indicated by CPU temperature 411, this is a timing of increasing the rotation speed of the general fan 121 to the preliminary rotation speed. At this time, as indicated by rotation speed 412, the rotation speed of the internal server fan 311 remains 2000 rpm being the minimum rotation speed. On the other hand, the rotation speed of the general fan 121 increases, if upon an increase in temperature, up to 2000 rpm between 50° C. or higher and lower than 60° C. as indicated by rotation speed 413. Thereafter, the rotation speed of the general fan 121 is maintained to be 2000 rpm until the CPU temperature exceeds 70° C. In this way, by increasing the rotation speed of the general fan 121 to the preliminary rotation speed, the rotation speed of the general fan 121 can appropriately follow the increase in the rotation speed of the internal server fan 311 at the subsequent first step. If upon a decrease in temperature, the rotation speed of the general fan 121 is maintained to be 2500 rpm between 50° C. or higher and lower than 70° C. as indicated by rotation speed 414. In this way, by maintaining the rotation speed of the general fan 121 to be a rotation speed higher than the minimum rotation speed, cooling of the CPU that is hard to cool can be promoted.

CPU temperature 421 indicating 70° C. or higher is a timing of increasing the rotation speed of the internal server fan 311 at the first step. At this time, the rotation speed of the internal server fan 311 reaches 12000 rpm as indicated by rotation speed 422. When the rotation speed of the internal server fan 311 increases to the rotation at the first step, if upon an increase in temperature, the rotation speed of the general fan 121 is controlled so that the pressure in the cold aisle becomes higher than the pressure in the hot aisle in the rack 13 to increase up to 3500 rpm as indicated by rotation speed 423. Conversely, if upon a decrease in temperature, the rotation speed of the general fan 121 is controlled so as to reach the rotation speed at which the pressure in the cold aisle becomes higher than the pressure in the hot aisle in the rack 13, and lowers to 4000 rpm from the rotation speed at 80° C. or higher as indicated by rotation speed 424. In this way, by increasing the rotation speed of the general fan 121 upon a decrease in temperature higher than that upon an increase in temperature, cooling of the CPU that is hard to cool can be promoted.

Furthermore, CPU temperature 431 indicating 80° C. or higher is a timing of increasing the rotation speed of the internal server fan 311 at the second step. At this time, the rotation speed of the internal server fan 311 reaches 14500 rpm as indicated by rotation speed 432. When the rotation speed of the internal server fan 311 increases to the rotation at the first step, both upon the increase in temperature and upon the decrease in temperature, the rotation speed of the general fan 121 is controlled so that the pressure in the cold aisle becomes higher than the pressure in the hot aisle in the rack 13. Both upon the increase in temperature and upon the decrease in temperature, the rotation speeds of the general fan 121 then reach 4500 rpm indicated by rotation speeds 433 and 434.

When an overall temperature is 90° C. or higher, the rotation speed of the internal server fan 311 reaches 15000 rpm. Then, the fan-operation management unit 321 determines the rotation speeds of the general fan 121 as 4500 rpm both upon the increase in temperature and upon the decrease in temperature. In this state, when the pressure in the cold aisle is lower than the pressure in the hot aisle in the rack 13, the fan-operation management unit 321 instructs the internal-server-fan controller 312 to decrease the rotation speed of the internal server fan 311. The fan-operation management unit 321 corresponds to an example of "control unit".

Referring back to FIG. 2, the explanation is continued. The fan unit 12 includes the general fan 121 and the general-fan controller 122.

The general fan 121 rotates at the rotation speed instructed from the general-fan controller 122, and takes in outside air to the cold aisle side of the container 11 through the outside air intake 14 (see FIG. 1). The general fan 121 then sends the taken-in outside air to the server 31. The general fan 121 has the minimum rotation speed. That is, the general fan 121 rotates at the minimum rotation speed or higher when the power supply is on.

The general-fan controller 122 receives an instruction of the rotation speed at which the general fan 121 is rotated from the fan-operation management unit 321. The general-fan controller 122 then controls the general fan 121 to rotate at the instructed rotation speed.

Figure 4:
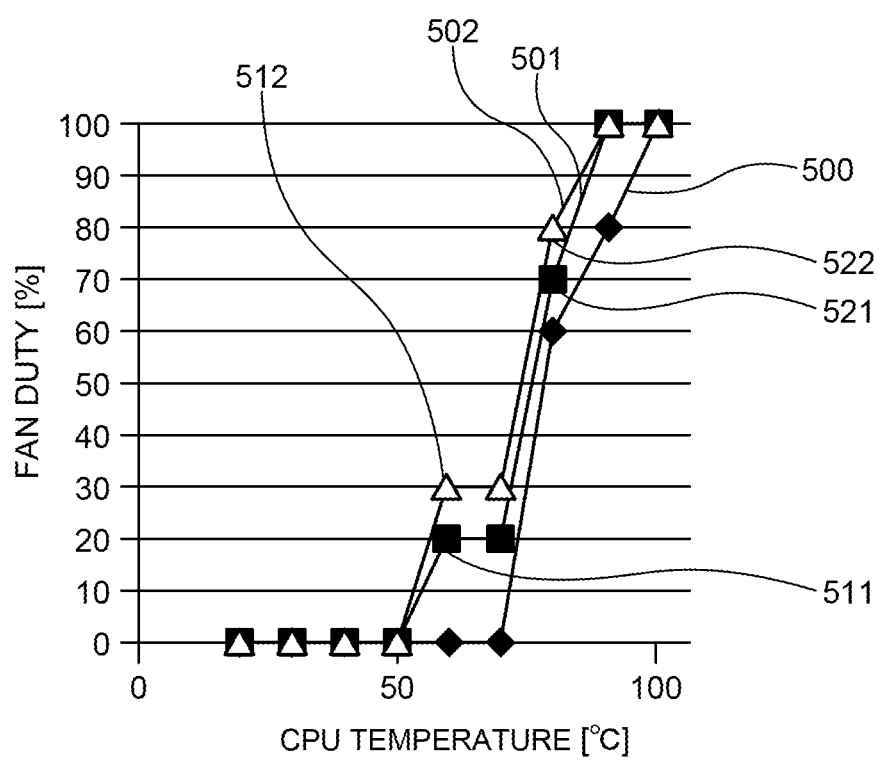
FIG. 4 is a diagram as a graph illustrating changes in rotation speeds of the internal server fan and the general fan.

FIG. 4 is a diagram as a graph illustrating changes in rotation speeds of the internal server fan and the general fan. As illustrated in FIG. 4, a duty of each fan is represented on a vertical axis and temperature is represented on a horizontal axis. A graph 500 in FIG. 4 represents a change in the rotation speed of the internal server fan 311. A graph 501 represents a change in the rotation speed of the general fan 121 upon an increase in temperature. A graph 502 represents a change in the rotation speed of the general fan 121 upon a decrease in temperature. A duty of each fan is such that, based on the maximum rotation speed being 100% and the minimum rotation speed being 0%, each value between the maximum rotation speed and the minimum rotation speed is a ratio of an increase from the minimum rotation speed to the maximum rotation speed. In this case, an addition value of the rotation speed upon a decrease in temperature to that upon an increase in temperature indicates an addition of 10% of a difference between the maximum rotation speed and the minimum rotation speed to the rotation speed upon the increase in temperature.

As illustrated in FIG. 4, it is understood that the duty of the general fan 121 is always the duty or more of the internal server fan 311. In other words, the container-type data center 1 according to the present embodiment rotates the general fan 121 more than the other and reduces the rotation of the internal server fan 311 as much as possible. The container-type data center 1 according to the present embodiment is configured not to rotate the internal server fan 311 until the CPU temperature reaches 80° C. When the server 31 is made independent and the CPU is cooled down only by the internal server fan 311, the rotation speed of the internal server fan 311 is increased at, for example, 20° C. or 30° C. In other words, in the container-type data center 1 according to the present embodiment, the internal server fan 311 continuously rotates at the minimum rotation speed until the CPU temperature becomes high as compared with the conventional technology.

The rotation speed of the general fan 121 is set higher upon a decrease in temperature than that upon an increase in temperature, so that the cooling of the CPU that is hard to cool is adequately promoted.

Furthermore, by increasing the rotation speed of the general fan 121 to the preliminary rotation speed as indicated by point 511, the rotation speed of the general fan 121 can be appropriately changed to the rotation speed corresponding to an increase in the rotation of the internal server fan 311 as indicated by point 521. When the rotation speed is to be decreased as indicated by point 522, by once maintaining the rotation speed indicated by point 512, the cooling of the CPU can be adequately promoted.

Figure 5:
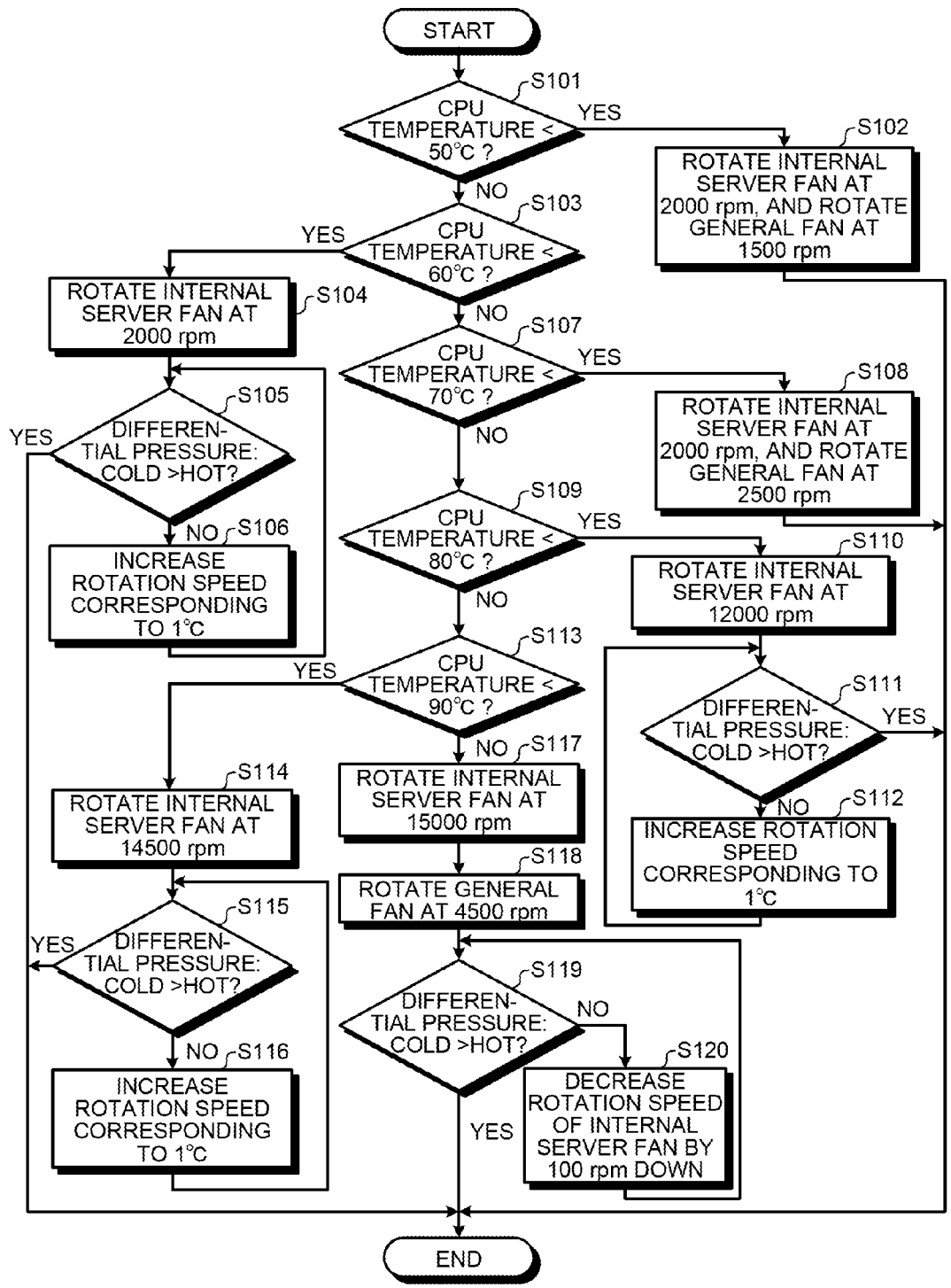
FIG. 5 is a flowchart of air conditioning control upon an increase in temperature of the container-type data center according to the first embodiment.

A flow of air conditioning control upon an increase in temperature of the container-type data center according to the present embodiment will be explained below with reference to FIG. 5. FIG. 5 is a flowchart of air conditioning control upon an increase in temperature of the container-type data center according to the first embodiment. Actually, as explained above, the fan-operation management unit 321 controls the rotation speed of the general fan 121 via the general-fan controller 122. However, for the sake of explanation, the case in which the fan-operation management unit 321 controls the rotation of the general fan 121 will be explained below. Although adjustment of the rotation speeds of the internal server fan 311 and the general fan 121 performed based on measurement of the CPU temperature at one time is explained in FIG. 5, the processes in the flowchart of FIG. 5 are actually repeated upon the increase in temperature.

The fan-operation management unit 321 and the internal-server-fan controller 312 determine whether the CPU temperature is lower than 50° C. (Step S101). When the CPU temperature is lower than 50° C. (Yes at Step S101), the internal-server-fan controller 312 rotates the internal server fan 311 at 2000 rpm. The fan-operation management unit 321 rotates the general fan 121 at 1500 rpm (Step S102). Thereafter, the fan-operation management unit 321 and the internal-server-fan controller 312 end the air conditioning control based on the current CPU temperature.

When the CPU temperature is 50° C. or higher (No at Step S101), the fan-operation management unit 321 and the internal-server-fan controller 312 determine whether the CPU temperature is lower than 60° C. (Step S103). When the CPU temperature is lower than 60° C. (Yes at Step S103), the internal-server-fan controller 312 rotates the internal server fan 311 at 2000 rpm (Step S104). The fan-operation management unit 321 then determines, based on the differential pressure, whether the pressure in the cold aisle side is higher than the pressure in the hot aisle side of the rack 13 (Step S105). When the pressure in the cold aisle side is higher than the pressure in the hot aisle side (Yes at Step S105), then the fan-operation management unit 321 and the internal-server-fan controller 312 end the air conditioning control based on the current CPU temperature. On the other hand, when the pressure in the cold aisle side is equal to or lower than the pressure in the hot aisle side (No at Step S105), the fan-operation management unit 321 refers to the preliminary table to acquire a rotation speed corresponding to 1° C. and increases the rotation speed of the general fan 121 by the acquired rotation speed (Step S106). Thereafter, the fan-operation management unit 321 returns to Step S105.

When the CPU temperature is 60° C. or higher (No at Step S103), the fan-operation management unit 321 and the internal-server-fan controller 312 determine whether the CPU temperature is lower than 70° C. (Step S107). When the CPU temperature is lower than 70° C. (Yes at Step S107), the internal-server-fan controller 312 rotates the internal server fan 311 at 2000 rpm. The fan-operation management unit 321 rotates the general fan 121 at 2000 rpm being the preliminary rotation speed (Step S108). Thereafter, the fan-operation management unit 321 and the internal-server-fan controller 312 end the air conditioning control based on the current CPU temperature.

When the CPU temperature is 70° C. or higher (No at Step S107), the internal-server-fan controller 312 determines whether the CPU temperature is lower than 80° C. (Step S109). When the CPU temperature is lower than 80° C. (Yes at Step S109), the internal-server-fan controller 312 rotates the internal server fan 311 at 12000 rpm (Step S110). Subsequently, the fan-operation management unit 321 determines, based on the differential pressure, whether the pressure in the cold aisle side is higher than the pressure in the hot aisle side of the rack 13 (Step S111). When the pressure in the cold aisle side is higher than the pressure in the hot aisle side (Yes at Step S111), then the fan-operation management unit 321 and the internal-server-fan controller 312 end the air conditioning control based on the current CPU temperature. On the other hand, when the pressure in the cold aisle side is equal to or lower than the pressure in the hot aisle side (No at Step S111), the fan-operation management unit 321 refers to the table for temperature increase to acquire a rotation speed corresponding to 1° C. and increases the rotation speed of the general fan 121 by the acquired rotation speed (Step S112). Thereafter, the fan-operation management unit 321 returns to Step S111.

When the CPU temperature is 80° C. or higher (No at Step S109), the internal-server-fan controller 312 determines whether the CPU temperature is lower than 90° C. (Step S113). When the CPU temperature is lower than 90° C. (Yes at Step S113), the internal-server-fan controller 312 rotates the internal server fan 311 at 14500 rpm (Step S114). Subsequently, the fan-operation management unit 321 determines, based on the differential pressure, whether the pressure in the cold aisle side is higher than the pressure in the hot aisle side of the rack 13 (Step S115). When the pressure in the cold aisle side is higher than the pressure in the hot aisle side (Yes at Step S115), then the fan-operation management unit 321 and the internal-server-fan controller 312 end the air conditioning control based on the current CPU temperature. On the other hand, when the pressure in the cold aisle side is equal to or lower than the pressure in the hot aisle side (No at Step S115), the fan-operation management unit 321 refers to the table for temperature increase to acquire a rotation speed corresponding to 1° C. and increases the rotation speed of the general fan 121 by the acquired rotation speed (Step S116). Thereafter, the fan-operation management unit 321 returns to Step S115.

When the CPU temperature is 90° C. or higher (No at Step S113), the internal-server-fan controller 312 rotates the internal server fan 311 at 15000 rpm (Step S117). Subsequently, the fan-operation management unit 321 rotates the general fan 121 at 4500 rpm (Step S118). Thereafter, the fan-operation management unit 321 determines, based on the differential pressure, whether the pressure in the cold aisle side is higher than the pressure in the hot aisle side of the rack 13 (Step S119). When the pressure in the cold aisle side is higher than the pressure in the hot aisle side (Yes at Step S119), then the fan-operation management unit 321 and the internal-server-fan controller 312 end the air conditioning control based on the current CPU temperature. On the other hand, when the pressure in the cold aisle side is equal to or lower than the pressure in the hot aisle side (No at Step S119), the fan-operation management unit 321 instructs the internal-server-fan controller 312 to decrease the rotation speed of the internal server fan 311 by 100 rpm. The internal-server-fan controller 312 decreases the rotation speed of the internal server fan 311 by 100 rpm (Step S120). Thereafter, the fan-operation management unit 321 returns to Step S119.

Figure 6:
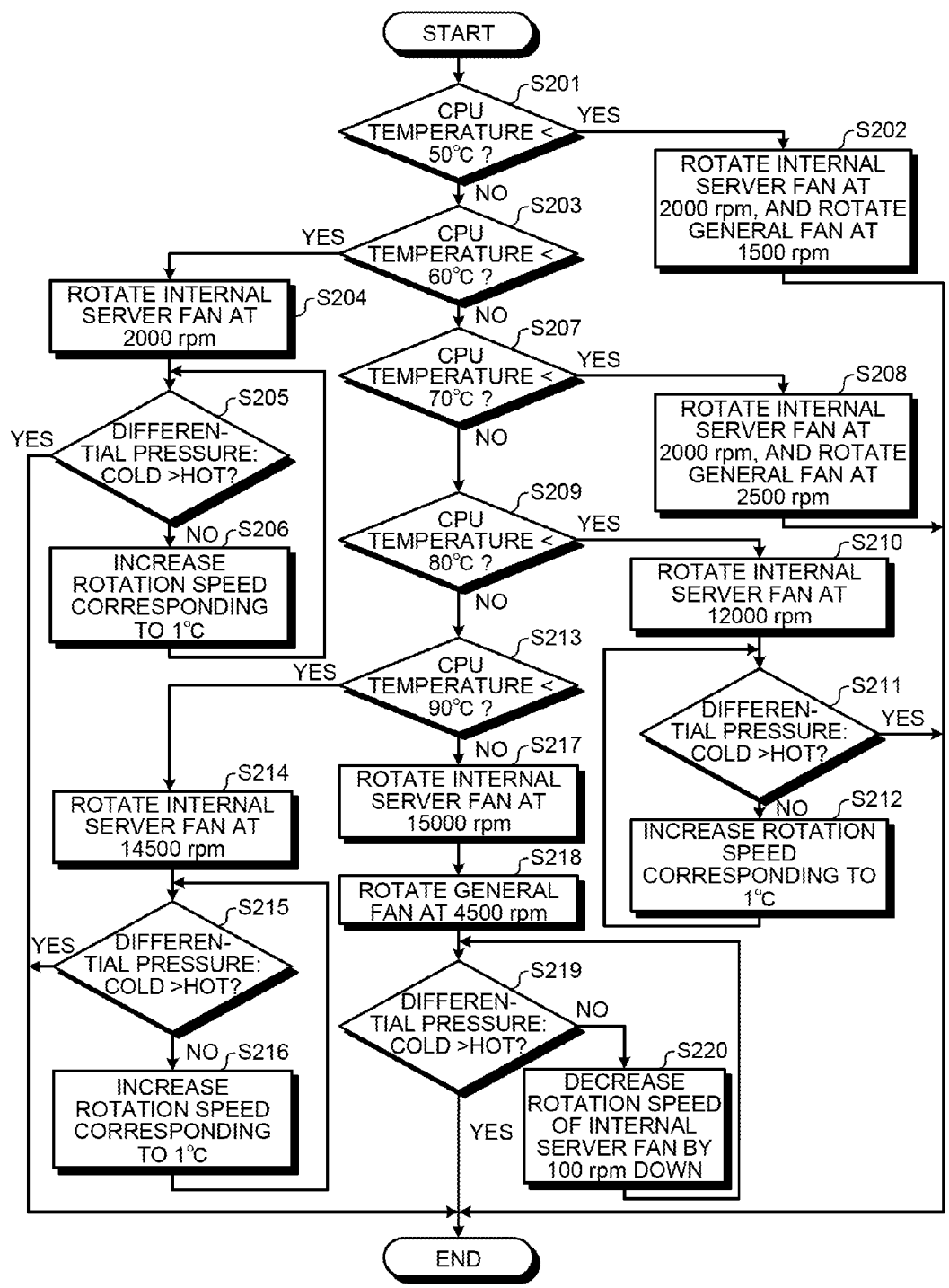
FIG. 6 is a flowchart of air conditioning control upon a decrease in temperature of the container-type data center according to the first embodiment.

A flow of air conditioning control upon a decrease in temperature of the container-type data center according to the present embodiment will be explained below with reference to FIG. 6. FIG. 6 is a flowchart of air conditioning control upon a decrease in temperature of the container-type data center according to the first embodiment. In this case also, for the sake of explanation, the case in which the fan-operation management unit 321 controls the rotation of the general fan 121 will be explained below. Although adjustment of the rotation speeds of the internal server fan 311 and the general fan 121 performed based on measurement of the CPU temperature at one time is explained in FIG. 6, the processes in the flowchart of FIG. 6 are actually repeated upon the decrease in temperature.

The fan-operation management unit 321 and the internal-server-fan controller 312 determine whether the CPU temperature is lower than 50° C. (Step S201). When the CPU temperature is lower than 50° C. (Yes at Step S201), the internal-server-fan controller 312 rotates the internal server fan 311 at 2000 rpm. The fan-operation management unit 321 rotates the general fan 121 at 1500 rpm (Step S202). Thereafter, the fan-operation management unit 321 and the internal-server-fan controller 312 end the air conditioning control based on the current CPU temperature.

When the CPU temperature is 50° C. or higher (No at Step S201), the fan-operation management unit 321 and the internal-server-fan controller 312 determine whether the CPU temperature is lower than 60° C. (Step S203). When the CPU temperature is lower than 60° C. (Yes at Step S203), the internal-server-fan controller 312 rotates the internal server fan 311 at 2000 rpm (Step S204). The fan-operation management unit 321 then determines, based on the differential pressure, whether the pressure in the cold aisle side is higher than the pressure in the hot aisle side of the rack 13 (Step S205). When the pressure in the cold aisle side is equal to or lower than the pressure in the hot aisle side (No at Step S205), the fan-operation management unit 321 acquires a rotation speed corresponding to 1° C. from the table for cooling and increases the rotation speed of the general fan 121 by the acquired rotation speed (Step S206). Thereafter, the fan-operation management unit 321 returns to Step S205. On the other hand, when the pressure in the cold aisle side is higher than the pressure in the hot aisle side (Yes at Step S205), then the fan-operation management unit 321 and the internal-server-fan controller 312 end the air conditioning control based on the current CPU temperature.

When the CPU temperature is 60° C. or higher (No at Step S203), the fan-operation management unit 321 and the internal-server-fan controller 312 determine whether the CPU temperature is lower than 70° C. (Step S207). When the CPU temperature is lower than 70° C. (Yes at Step S207), the internal-server-fan controller 312 rotates the internal server fan 311 at 2000 rpm. The fan-operation management unit 321 rotates the general fan 121 at 2500 rpm being the cooling rotation speed (Step S208). Thereafter, the fan-operation management unit 321 and the internal-server-fan controller 312 end the air conditioning control based on the current CPU temperature.

When the CPU temperature is 70° C. or higher (No at Step S207), the internal-server-fan controller 312 determines whether the CPU temperature is lower than 80° C. (Step S209). When the CPU temperature is lower than 80° C. (Yes at Step S209), the internal-server-fan controller 312 rotates the internal server fan 311 at 12000 rpm (Step S210). Subsequently, the fan-operation management unit 321 determines, based on the differential pressure, whether the pressure in the cold aisle side is higher than the pressure in the hot aisle side of the rack 13 (Step S211). When the pressure in the cold aisle side is equal to or lower than the pressure in the hot aisle side (No at Step S211), the fan-operation management unit 321 acquires a rotation speed corresponding to 1° C. and increases the rotation speed of the general fan 121 by the acquired rotation speed (Step S212). Thereafter, the fan-operation management unit 321 returns to Step S211. On the other hand, when the pressure in the cold aisle side is higher than the pressure in the hot aisle side (Yes at Step S211), then the fan-operation management unit 321 and the internal-server-fan controller 312 end the air conditioning control based on the current CPU temperature.

When the CPU temperature is 80° C. or higher (No at Step S209), the internal-server-fan controller 312 determines whether the CPU temperature is lower than 90° C. (Step S213). When the CPU temperature is lower than 90° C. (Yes at Step S213), the internal-server-fan controller 312 rotates the internal server fan 311 at 14500 rpm (Step S214). Subsequently, the fan-operation management unit 321 determines, based on the differential pressure, whether the pressure in the cold aisle side is higher than the pressure in the hot aisle side of the rack 13 (Step S215). When the pressure in the cold aisle side is higher than the pressure in the hot aisle side (Yes at Step S215), then the fan-operation management unit 321 and the internal-server-fan controller 312 end the air conditioning control based on the current CPU temperature. On the other hand, when the pressure in the cold aisle side is equal to or lower than the pressure in the hot aisle side (No at Step S215), the fan-operation management unit 321 acquires a rotation speed corresponding to 1° C. and increases the rotation speed of the general fan 121 by the acquired rotation speed (Step S216). Thereafter, the fan-operation management unit 321 returns to Step S215.

When the CPU temperature is 90° C. or higher (No at Step S213), the internal-server-fan controller 312 rotates the internal server fan 311 at 15000 rpm (Step S217). Subsequently, the fan-operation management unit 321 rotates the general fan 121 at 4500 rpm (Step S218). Thereafter, the fan-operation management unit 321 determines, based on the differential pressure, whether the pressure in the cold aisle side is higher than the pressure in the hot aisle side of the rack 13 (Step S219). When the pressure in the cold aisle side is higher than the pressure in the hot aisle side (Yes at Step S219), then the fan-operation management unit 321 and the internal-server-fan controller 312 end the air conditioning control based on the current CPU temperature. On the other hand, when the pressure in the cold aisle side is equal to or lower than the pressure in the hot aisle side (No at Step S219), the fan-operation management unit 321 instructs the internal-server-fan controller 312 to decrease the rotation speed of the internal server fan 311 by 100 rpm. The internal-server-fan controller 312 decreases the rotation speed of the internal server fan 311 by 100 rpm (Step S220). Thereafter, the fan-operation management unit 321 returns to Step S219.

Figure 7:
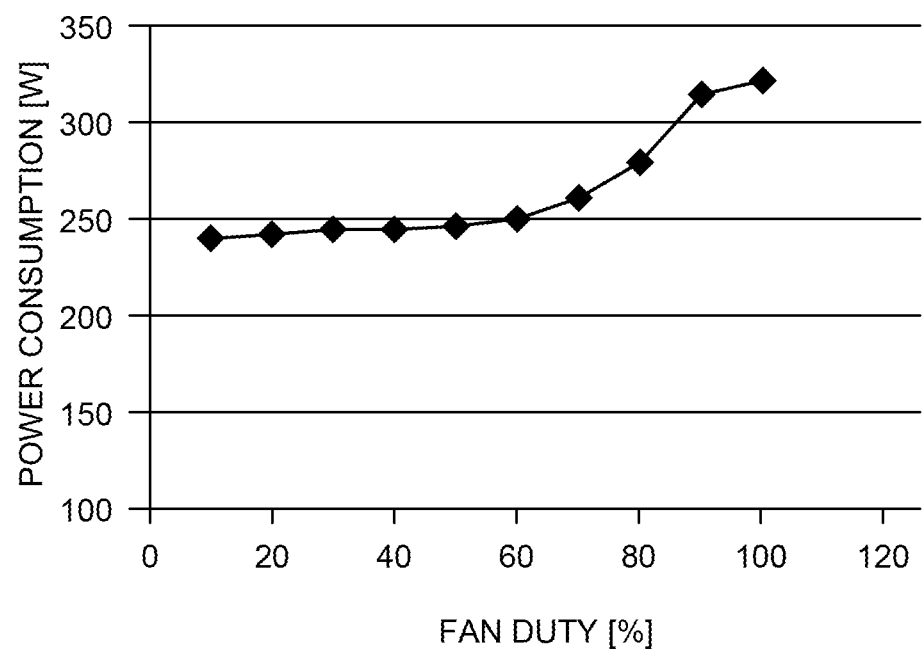
FIG. 7 is a diagram for explaining an example of power consumption of the internal server fan.
Figure 8:
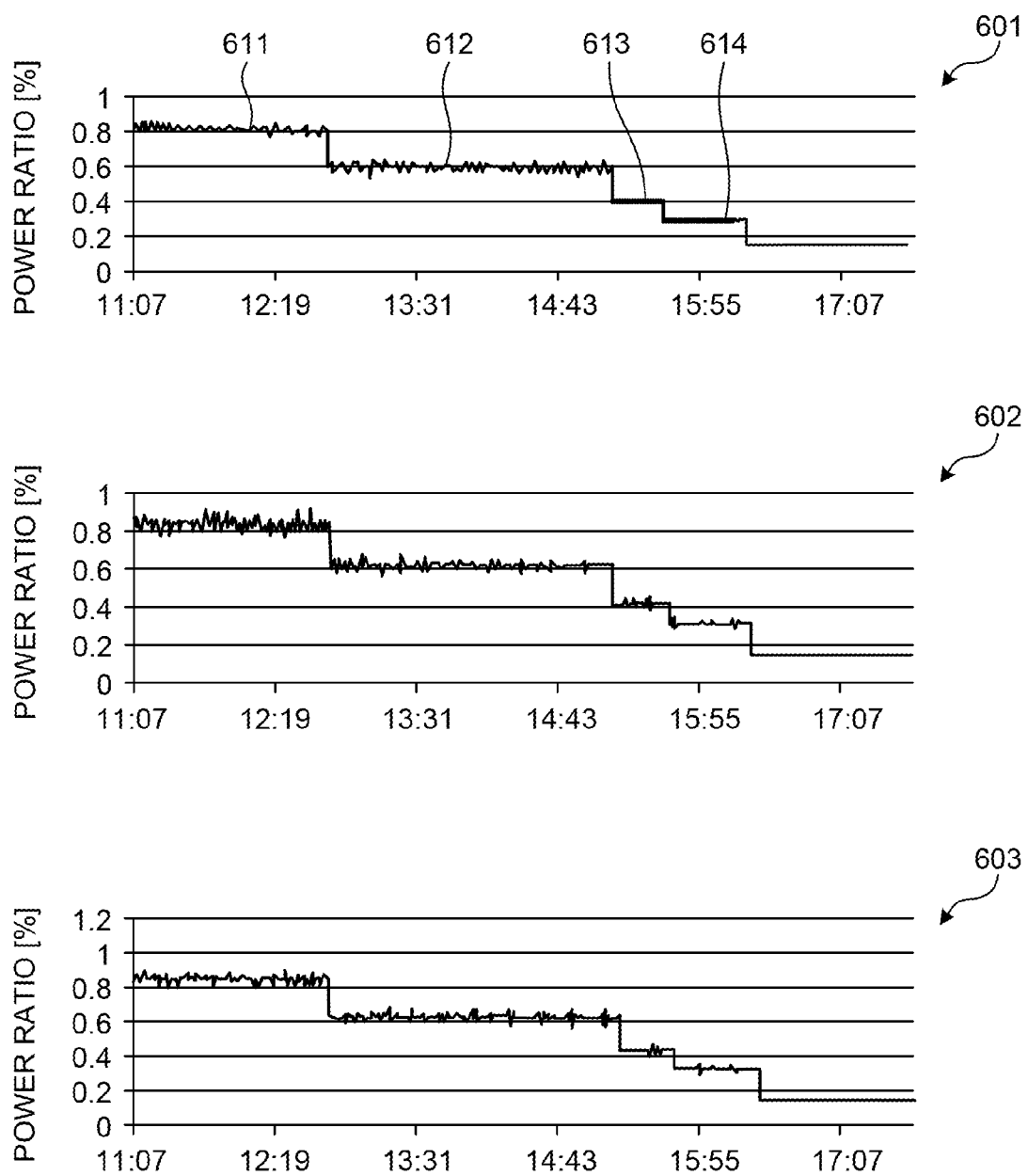
FIG. 8 is a diagram for explaining an example of power consumption of the general fan.

FIG. 7 is a diagram for explaining an example of power consumption of the internal server fan. FIG. 8 is a diagram for explaining an example of power consumption of the general fan.

As illustrated in FIG. 7, power consumption of the internal server fan 311 sharply increases when the duty being the rotation speed is about to exceed 60%. FIG. 7 depicts power consumption when the internal server fan 311 in the server 31 provided in the rack 13 is operating. At this time, when one unit of server 31 is provided therein, the power consumption of the internal server fan 311 is between 60% and 100% i.e. an average of 70 W. Assuming that 40 servers 31 are provided in one rack 13, that there are 8 racks 13, and that an operation rate of each of the servers 31 is 50%, then the power consumption of the internal server fans 311 becomes as follows: 70×40×8×0.5=11.2 kW.

Meanwhile, graphs 601 to 603 represent, when three fan units 12 are provided in the container 11, power consumption of each of the fan units 12. The vertical axes of the graphs 601 to 603 represent a power ratio and the horizontal axes thereof represent a time. The power ratio of power consumption mentioned here is a value of power consumption when the power consumption in the case of the maximum rotation speed is set to 1. The graphs 601 to 603 represent power consumption of each of the fan units 12 when the duty being the rotation speed of the general fan 121 is changed at a certain time. For example, a portion 611 in the graphs 601 represents a case in which the duty of the rotation speed of the general fan 121 is 90%. Additionally, a portion 612-614 in the graphs 601 represents a case in which the duty of the rotation speed of the general fan 121 is less than 90%. As illustrated in the graphs 601 to 603, when the duty being the rotation speed of the general fan 121 is 90%, each power consumption of the fan units 12 is 0.82 kW, 0.83 kW, and 0.84 kW. Therefore, even when the duty being the rotation speed of the general fan 121 is 90%, the total power consumption of the fan units 12 becomes 2.49 kW.

In this way, the internal server fan 311 of the server 31 provided in the container-type data center 1 consumes much more power as compared to that of the fan unit 12. Therefore, the way to cool down the CPU by suppressing the rotation of the internal server fan 311 and rotating the fan unit 12 by that amount can more suppress the power consumption.

Figure 9:
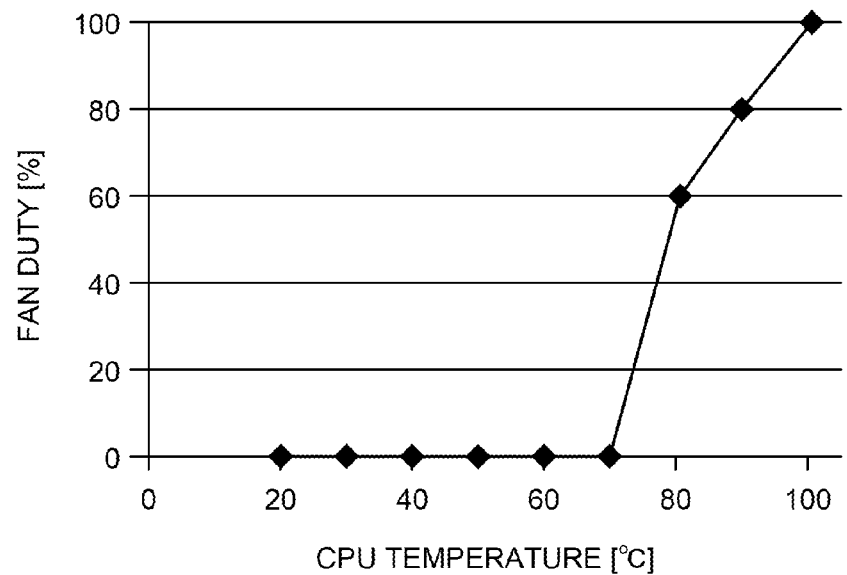
FIG. 9 is a diagram illustrating a change in the rotation speed of the internal server fan according to the first embodiment.
Figure 10:
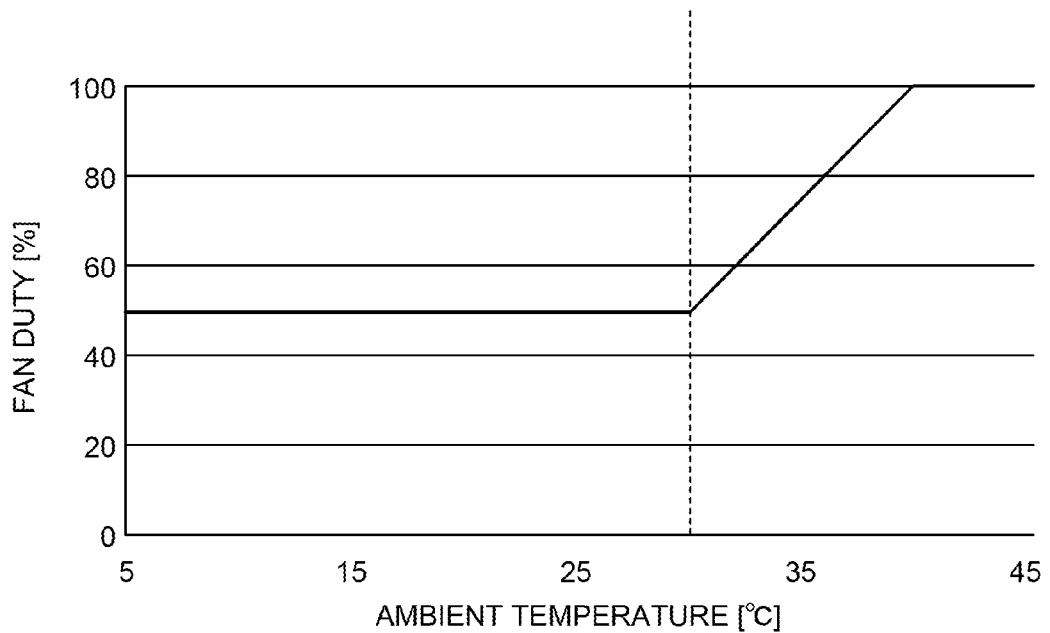
FIG. 10 is a diagram illustrating a change in the rotation speed of the internal server fan when the server is used independently.
Figure 11:
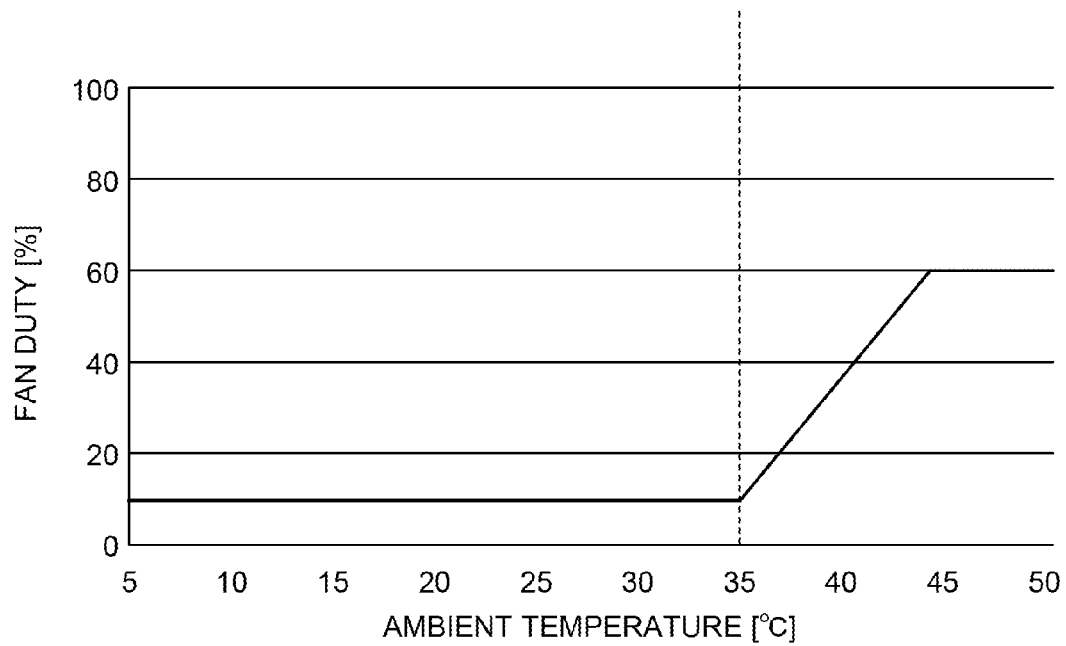
FIG. 11 is a diagram illustrating a change in the rotation speed of the internal server fan as a power saving model when the server is used independently.

FIG. 9 is a diagram illustrating a change in the rotation speed of the internal server fan according to the first embodiment. FIG. 10 is a diagram illustrating a change in the rotation speed of the internal server fan when the server is used independently. FIG. 11 is a diagram illustrating a change in the rotation speed of the internal server fan as a power saving model when the server is used independently.

When the server 31 is used independently, the internal server fan 311 is controlled based on ambient temperature. If it is not the power saving model, as illustrated in FIG. 10, the rotation speed of the internal server fan 311 starts to increase when the ambient temperature is around 30° C. Even if it is the power saving model, as illustrated in FIG. 11, the rotation speed of the internal server fan 311 starts to increase when the ambient temperature is around 35° C. The temperature when the rotation speed of the internal server fan 311 increases at around 30° C. in FIG. 10 and at around 35° C. in FIG. 11 to reach a given rotation speed corresponds to an example of "a temperature at which the rotation of the second fan becomes the first rotation when the second fan cools down independently the inside of the electronic device".

On the other hand, as illustrated in FIG. 9, the rotation speed of the internal server fan 311 in the server 31 provided in the container-type data center 1 according to the present embodiment starts to increase when the CPU temperature is around 70° C. This is because, in the container-type data center 1 according to the present embodiment, the CPU temperature can be suppressed even if the internal server fan 311 is not rotated because the rotation of the general fan 121 causes the CPU temperature to be decreased.

As explained above, in the present embodiment, the rotation of the internal server fan is decreased and the general fan 121 is rotated instead to thereby decrease the CPU temperature, which enables the total power consumption of the container-type data center to be reduced.

In the explanation above, the internal server fan 311 is rotated at 12000 rpm when the CPU temperature reaches 70° C. or higher, is rotated at 14500 rpm when the CPU temperature reaches 80° C. or higher, and is rotated at 15000 rpm when the CPU temperature reaches 90° C. or higher. However, the timing of increasing the rotation speed of the internal server fan 311 and the rotation speed after its increase are preferably set according to the operation of the server. For example, when the CPU temperature becomes a value lower by 20% than the upper limit of an allowable temperature of the CPU, the internal server fan 311 may be rotated at a duty of 60%, and when the CPU temperature becomes a value lower by 10% than the upper limit, the internal server fan 311 may be rotated at a duty of 80%, or the like. In this case, also, similarly to the first embodiment, the general fan 121 is made to rotate so that the pressure in the cold aisle side is higher than the pressure in the hot aisle side of the rack 13 upon an increase in the rotation of the internal server fan 311.

Furthermore, in the present embodiment, the general fan 121 is rotated at the preliminary rotation speed before the rotation of the internal server fan 311 upon an increase in temperature in order to follow an increase in the rotation of the internal server fan 311. However, for example, when a reaction speed of the general fan 121 is high, the general fan 121 does not need to be rotated at the preliminary rotation speed. In addition, if the CPU can be cooled down satisfactorily, the rotation speed of the general fan 121 does not need to be maintained to be the minimum rotation speed or higher after the rotation speed of the internal server fan 311 becomes the minimum rotation speed upon the decrease in temperature.

Moreover, if the CPU temperature is easy to decrease, there is no need to set a difference between the rotation speeds of the general fan 121 upon an increase in temperature and upon a decrease in temperature.

Figure 12:
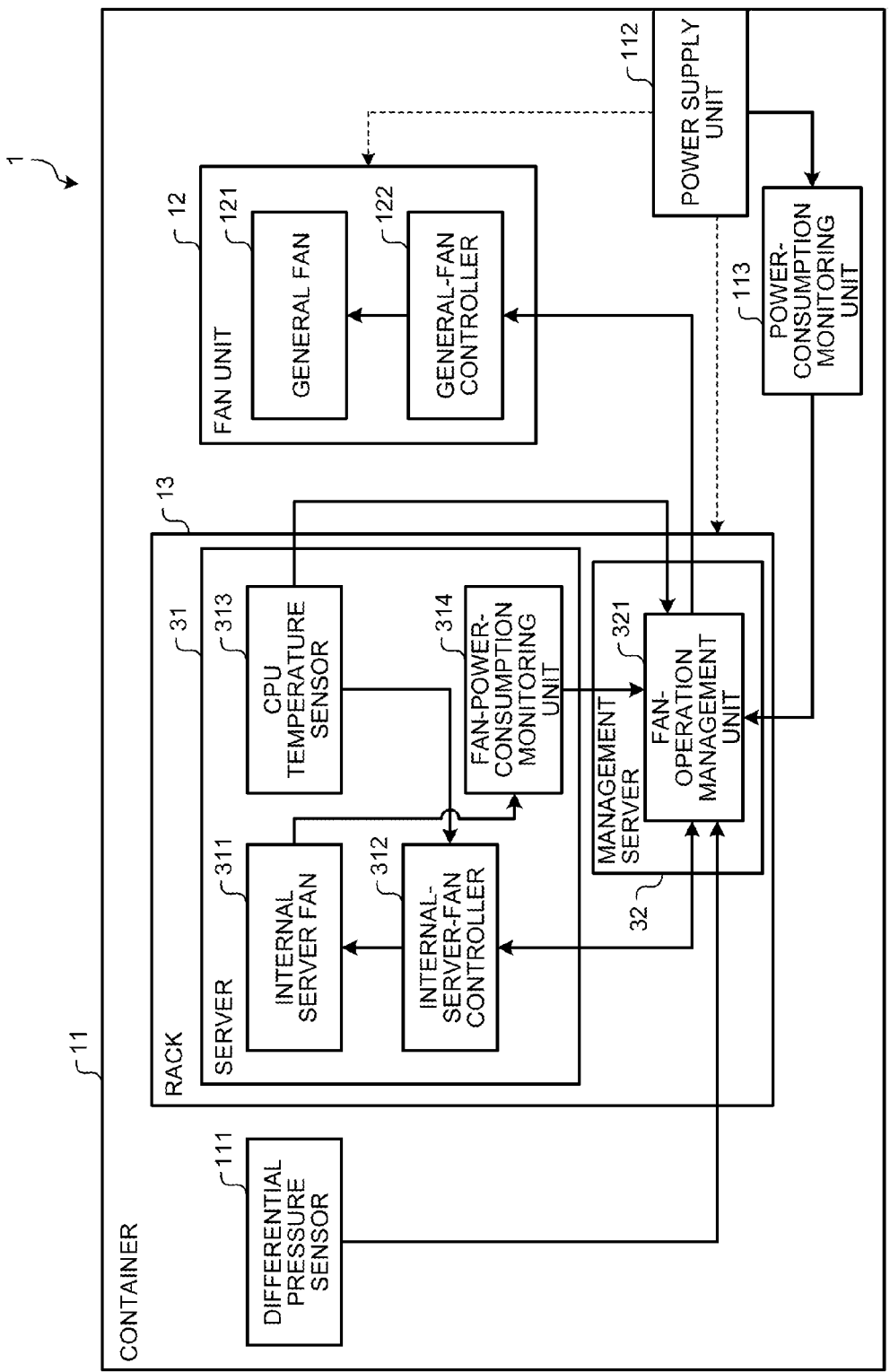
FIG. 12 is a block diagram of a container-type data center according to a second embodiment.

FIG. 12 is a block diagram of a container-type data center according to a second embodiment. The container-type data center 1 according to the present embodiment is different from the first embodiment in that the rotation speeds of the internal server fan 311 and the general fan 121 are controlled by monitoring the power consumption in addition to the air conditioning control according to the first embodiment. Therefore, the air conditioning control performed by monitoring the power consumption will be mainly explained below. The units of FIG. 12 having the same reference signs as these of FIG. 2 are assumed to have the same functions as these of FIG. 2 unless otherwise specified.

The container-type data center 1 according to the present embodiment includes a power supply unit 112 and a power-consumption monitoring unit 113, in addition to the units in the first embodiment. The server 31 according to the present embodiment further includes a fan-power-consumption monitoring unit 314.

The power supply unit 112 is implemented by, for example, the power panel 18 of FIG. 1. A dotted line in FIG. 12 indicates a power supply from the power supply unit 112. The line indicating the power supply in FIG. 12 is only an example, and therefore the power is supplied from the power supply unit 112 to the other units that use electricity. Although the power supply unit 112 is not described in FIG. 2 because the explanation thereof is not needed in the first embodiment, the power is also supplied from the power panel 18 to the units in the first embodiment.

The power-consumption monitoring unit 113 monitors the power consumption in a power system for supplying the power to the general fan 121 in the power supply unit 112, and measures the power consumption of the general fan 121. The power-consumption monitoring unit 113 then notifies the fan-operation management unit 321 of the power consumption of the general fan 121.

The fan-power-consumption monitoring unit 314 measures the power consumption of the internal server fan 311. The fan-power-consumption monitoring unit 314 then notifies the fan-operation management unit 321 of the power consumption of the internal server fan 311. The fan-power-consumption monitoring unit 314 and the power-consumption monitoring unit 113 correspond to an example of "power-consumption measuring unit".

The fan-operation management unit 321 receives the notification on the power consumption of the general fan 121 from the power-consumption monitoring unit 113. The fan-operation management unit 321 also receives the notification on the power consumption of the internal server fan 311 from the fan-power-consumption monitoring unit 314.

The fan-operation management unit 321 then determines whether the power consumption of the general fan 121 is more than the power consumption of the internal server fan 311. When the power consumption of the general fan 121 is more than the power consumption of the internal server fan 311, the fan-operation management unit 321 instructs the internal-server-fan controller 312 to increase the rotation speed of the internal server fan 311. At this time, the fan-operation management unit 321 also instructs the general-fan controller 122 to decrease the rotation speed of the general fan 121.

As explained above, the container-type data center according to the present embodiment is configured to increase the rotation speed of the internal server fan and decrease the rotation speed of the general fan when the power consumption of the internal server fan is less than the power consumption of the general fan. Thus, even if the power consumption of the internal server fan becomes less than the power consumption of the general fan, the power consumption can be adequately suppressed.

FIG. 13 is a block diagram of a container-type data center according to a third embodiment. The container-type data center 1 according to the present embodiment is different from the first embodiment in that the rotation speeds of the internal server fan 311 and the general fan 121 are controlled by outside temperature in addition to the air conditioning control according to the first embodiment. Therefore, the air conditioning control according to outside temperature will be mainly explained below. The units of FIG. 13 having the same reference signs as these of FIG. 2 are assumed to have the same functions as these of FIG. 2 unless otherwise specified.

An outside temperature sensor 114 is located, for example, near the outside air intake 14. In the present embodiment, the outside temperature sensor 114 is located in the container 11. However, the outside temperature sensor 114 may be located in any other place, for example, outside the container 11 if the outside air can be measured in the place.

The outside temperature sensor 114 measures the temperature of the outside air introduced through the outside air intake 14 and then outputs the measured outside temperature to the fan-operation management unit 321.

The fan-operation management unit 321 includes the preliminary temperature, the cooling temperature, the preliminary table, the table for cooling, the table for temperature increase, and the table for temperature decrease at each outside temperature. These values are generated so that the rotation speed of the general fan 121 decreases as the outside temperature decreases.

The fan-operation management unit 321 receives an input being the outside temperature from the outside temperature sensor 114. The fan-operation management unit 321 then acquires the preliminary temperature, the cooling temperature, the preliminary table, the table for cooling, the table for temperature increase, and the table for temperature decrease corresponding to the received outside temperature. Subsequently, the fan-operation management unit 321 uses the acquired preliminary temperature, cooling temperature, preliminary table, table for cooling, table for temperature increase, and table for temperature decrease to control the rotation speed of the general fan 121.

As explained above, the container-type data center according to the present embodiment controls the rotation speed of the general fan according to the outside temperature. Thus, when the outside temperature is low and the CPU can be cooled down without much increasing the rotation speed of the general fan, the rotation speed of the general fan can be reduced to a low value and the power consumption can thereby be suppressed.

In the above explanation, the method of controlling the rotation speeds of the internal server fan and the general fan according to the temperature of the CPU has been explained; however, the rotation speed may be controlled according to a temperature of any component including not only the CPU but also, for example, memory if the component is a heat-producing component provided in the server.

According to one aspect of the container-type data center, the air-conditioning control program, and the air-conditioning control method disclosed in the present application, the power consumption can be suppressed.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A container-type data center comprising:
   a container that includes an electronic device;
   a first fan that takes in outside air to the container and sends the taken-in outside air to the electronic device;
   a second fan that is built into the electronic device, cools down a heat-producing component provided in the electronic device, and rotates at a first rotation speed when a temperature of the heat-producing component is a first threshold or more, and rotates at a second rotation speed which is higher than the first rotation speed when the temperature of the heat-producing component is a second threshold or more which is higher than the first threshold;
   a differential pressure sensor that measures a differential pressure between a pressure in an intake air side and a pressure in an exhaust air side of the second fan; and
   a control unit that controls a rotation speed of the first fan and a rotation speed of the second fan based on a temperature of the heat-producing component and, when the second fan rotates at the first rotation speed or at the second rotation speed and a pressure in the exhaust air side is higher than a pressure in the intake air side, repeats controlling the rotation speed of the first fan so that the temperature of the heat-producing component increases by a predetermined temperature to make the pressure in the intake air side higher than the pressure in the exhaust air side, based on a measurement result of the differential pressure sensor.

2. The container-type data center according to claim 1, wherein the control unit controls the rotation speed of the first fan and the rotation speed of the second fan separately at a plurality of steps.

3. The container-type data center according to claim 1, wherein the first threshold is a temperature lower by 20 degrees from an upper limit of an allowable value of the temperature of the heat-producing component, and the second threshold is a temperature lower by 10 degrees from the upper limit of the allowable value.

4. The container-type data center according to claim 1, wherein
the second fan rotates at a minimum rotation speed when the temperature of the heat-producing component is lower than the first threshold, and
the control unit rotates, when the second fan rotates at the minimum rotation speed, the first fan at the minimum rotation speed.

5. The container-type data center according to claim 1, wherein the control unit gradually increases, when the temperature of the heat-producing component increases, the rotation speed of the first fan from the minimum rotation speed with the temperature of the heat-producing component approaching the first threshold, and gradually decreases, when the temperature of the heat-producing component decreases, the rotation speed of the first fan to the minimum rotation speed with the temperature of the heat-producing component reaching lower than the first threshold.

6. The container-type data center according to claim 1, wherein the control unit controls the rotation speed of the first fan to be increased when the temperature of the heat-producing component decreases, as compared with a case in which the temperature of the heat-producing component increases.

7. The container-type data center according to claim 1, further comprising
a power-consumption measuring unit that measures power consumption of the first fan and power consumption of the second fan, wherein
the control unit decreases the rotation speed of the first fan and increases the rotation speed of the second fan when the power consumption of the first fan is equal to or more than the power consumption of the second fan.

8. The container-type data center according to claim 1, further comprising
an outside temperature sensor that measures outside temperature, wherein
the control unit controls the rotation speed of the first fan based on the outside temperature measured by the outside temperature sensor in addition to the measurement result of the differential pressure sensor.

9. A non-transitory computer-readable recording medium having stored therein air-conditioning control program for causing a computer to execute a process for a container-type data center that includes
a container that includes an electronic device,
a first fan that takes in outside air to the container and sends the taken-in outside air to the electronic device,
a second fan that is built into the electronic device and cools down a heat-producing component provided in the electronic device,
the process comprising:

measuring a temperature of the heat-producing component;

measuring a differential pressure between a pressure in an intake air side and a pressure in an exhaust air side of the second fan;

controlling rotation speed of the second fan so that the second fan rotates at a first rotation speed when a temperature of the heat-producing component is a first threshold or more, and rotates at a second rotation speed which is higher than the first rotation speed when the temperature of the heat-producing component is a second threshold or more which is higher than the first threshold;

controlling a rotation speed of the first fan and a rotation speed of the second fan based on the measured temperature of the heat-producing component; and repeating controlling the rotation speed of the first fan so that the temperature of the heat-producing component increases by a predetermined temperature to make a pressure in the intake air side higher than a pressure in the exhaust air side, based on a measurement result of the differential pressure sensor, when the second fan rotates at the first rotation speed or at the second rotation speed and the pressure in the exhaust air side is higher than the pressure in the intake air side.

10. An air-conditioning control method for a container-type data center that includes
a container that includes an electronic device,
a first fan that takes in outside air to the container and sends the taken-in outside air to the electronic device, and
a second fan that is built into the electronic device and cools down a heat-producing component provided in the electronic device, the air-conditioning control method comprising:

measuring a temperature of the heat-producing component;

measuring a differential pressure between a pressure in an intake air side and a pressure in an exhaust air side of the second fan;

controlling rotation speed of the second fan so that the second fan rotates at a first rotation speed when a temperature of the heat-producing component is a first threshold or more, and rotates at a second rotation speed which is higher than the first rotation speed when the temperature of the heat-producing component is a second threshold or more which is higher than the first threshold;

controlling a rotation speed of the first fan and a rotation speed of the second fan based on the measured temperature of the heat-producing component; and repeating controlling the rotation speed of the first fan so that the temperature of the heat-producing component increases by a predetermined temperature to make a pressure in the intake air side higher than a pressure in the exhaust air side, based on a measurement result of the differential pressure sensor, when the second fan rotates at the first rotation speed or at the second rotation speed and the pressure in the exhaust air side is higher than the pressure in the intake air side.

* * * * *